United States Patent
Gopalakrishnan et al.

(10) Patent No.: US 7,941,737 B2
(45) Date of Patent: May 10, 2011

(54) LOW DENSITY PARITY CHECK CODE DECODER

(75) Inventors: Subramanyam Harihara Gopalakrishnan, Karnataka (IN); Chandra Girish Mariswamy, Karnataka (IN); Nimmagadda Venkataratnam Balaramakrishnaiah, Karnataka (IN); Gowda Pramod Nanje, Karnataka (IN); Balamuralidhar Purushothaman, Karnataka (IN); Adiga Suryanarayana Vishnumurthy, Karnataka (IN); Purushothama Ravindra, Karnataka (IN)

(73) Assignee: Tata Consultancy Services Limited, Mumbai (IN)

( * ) Notice: Subject to any disclaimer, the term of this patent is extended or adjusted under 35 U.S.C. 154(b) by 999 days.

(21) Appl. No.: 11/787,540

(22) Filed: Apr. 17, 2007

(65) Prior Publication Data

US 2007/0283218 A1    Dec. 6, 2007

(30) Foreign Application Priority Data

Apr. 19, 2006    (IN) .......................... 613/MUM/2006

(51) Int. Cl.
*G06F 11/00*    (2006.01)
*H03M 13/00*    (2006.01)
(52) U.S. Cl. .......................................... 714/804
(58) Field of Classification Search .................. 714/746, 714/752, 800–801, 804
See application file for complete search history.

(56) References Cited

U.S. PATENT DOCUMENTS

| | | | | |
|---|---|---|---|---|
| 6,938,196 B2* | 8/2005 | Richardson et al. | .......... | 714/752 |
| 7,137,060 B2* | 11/2006 | Yu et al. | ......................... | 714/794 |
| 7,143,333 B2* | 11/2006 | Blankenship et al. | ......... | 714/781 |

* cited by examiner

*Primary Examiner* — Shelly A Chase
(74) *Attorney, Agent, or Firm* — Charles A. Muserlian

(57) ABSTRACT

An error correction system for decoding transmitted data in multichannels is disclosed. The system uses low density parity check nodes. A method of error correction using LDPC is also disclosed.

22 Claims, 19 Drawing Sheets

LOW DENSITY PARITY CHECK CODE DECODER

FIELD OF THE INVENTION

This invention relates to a system for information decoding.

In particular, this invention relates to a decoding system using low density parity check codes.

BACKGROUND OF THE INVENTION

The use and implementation of computer networks has become very popular. Networks such as Local area networks (LANs), Metropolitan area networks (MANs), Wireless LANs (WLANs) and the like, are being widely implemented for the purpose of accessing data. The use of such networks has led to the development of various international standards in the field of communication such as WiFi and WiMAX.

WiMAX is a wireless metropolitan area network (MAN) technology that can connect Wi-Fi hotspots with each other and to other parts of the Internet and provide a wireless alternative to cable and DSL. WiMAX provides up to 50 km (31 miles) of linear service area range and allows connectivity between users without a direct line of sight. The technology has been claimed to provide shared data rates up to 70 Mbit/s, which, according to WiMAX proponents, is enough bandwidth to simultaneously support more than 60 businesses and well over a thousand homes at 1 Mbit/s DSL-level connectivity. Real world tests, however, show practical maximum data rates between 500 kbit/s and 2 Mbit/s, depending on conditions at a given site.

Also WiMAX allows interpenetration for broadband service provision of VoIP, video, and Internet access simultaneously. Even in areas without pre-existing physical cable or telephone networks, WiMAX allows access between networks which are within range of each other. WiMAX antennas share a cell tower without compromising the function of cellular arrays already in place. WiMAX antennas may also be connected to an Internet backbone via either a light fiber optics cable or a directional microwave link. WiMAX also facilitates increase in bandwidth for a variety of data-intensive applications.

WiMAX has become synonymous with the IEEE 802.16 standard family, an emerging standard for fixed and mobile MAN (Metropolitan Area Network) Broadband Wireless Access (BWA). The original 802.16 and the subsequently amended 802.16a standards are both used for fixed BWA. The latter caters for non-line of sight (NLOS) applications, as BWA is increasingly becoming a residential application. The latest 802.16e amendment is supporting for mobility (mobility at vehicular speeds, around 120 km/h) in WiMAX system. The 802.16e standard will allow users' hardware (notebooks, personal digital assistants (PDAs)) to access high speed Internet, and while roaming outside of the WiFi (Wireless Fidelity) hotspots. The 802.16 standard supports high data rates (up to about 70 Mbps) with a variety of channel coding options. The mandatory scheme is a convolutional code. Convolutional turbo codes, turbo product codes and LDPC codes are optional. These optional codes can be used to ensure robustness in extreme fading channels.

LDPC codes are linear block codes originally proposed by Gallager in the early 1960s. Their parity check matrix is sparse and has low density of one's. The original codes were regular codes having uniform column and row weight in the parity check matrix. Recently, these codes have emerged as competitors for turbo codes, with capacity approaching performance. Better performance of LDPC codes is achieved with a proper choice of code and decoding signal processing. A popular LDPC decoding algorithm is the Belief Propagation algorithm also referred to as Sum-Product algorithm. The Sum-product algorithm is a message passing algorithm operating on the Tanner graph, which is a bipartite graph representing the parity check matrix and consisting of variable nodes and check nodes. A bipartite graph is a special graph where the set of vertices can be divided into two disjoint sets with two vertices of the same set never sharing an edge.

PRIOR ART

The main challenge in the LDPC code decoder hardware implementation is to effectively manage the message passing during the iterative belief propagation (BP) decoding. The system and device for decoding usually uses three schemes: (1) Parallel (2) Serial and (3) Semi Parallel.

Fully parallel decoders directly instantiate the bipartite graph of the LDPC code to the hardware. Each individual variable node or check node is physically implemented as node functional unit, and all the units are connected through an interconnection network reflecting the bipartite graph connectivity. There is no need for central memory blocks to store the messages. They can be latched close to the processing units. Such fully parallel decoders can achieve very high decoding throughput in terms of bits per second. But, area of implementation due to the physical implementation of all the processing units and interconnect routing make this approach infeasible for large block lengths. Further, the parallel hardware design is fixed to a particular parity check matrix. This prohibits the reconfigurability required when the block length or rate of the code changes.

Fully-serial architecture has a smaller area since it is sufficient to have just one variable node computational unit (VCU) and one check node computational unit (CCU). The fully-serial approach is suitable for Digital Signal Processors in which there are only a few functional units available to use. However, the speed of decoding is very low in a serial decoder.

The prior art system or device which uses the Sum-Product algorithm incorporates means that are adpated to use Tanner graph. The device has a mechanism for the initialization and means in which each iteration message passing occurs from each check node to all adjacent variable nodes in the first half of the iteration and from each variable node to its adjacent check nodes in the second half of the iteration. The device also has a mechanism by which repeated iterations of the message passing along the edges of the graph, with some stopping criterion.

The steps involved in the implementation of the Sum-product algorithm are given in the following for sign-magnitude processing form:

Initialization: $T^{(0)}_{n,m} = I_n$; $E^{(0)}_{n,m} = 0$

Iteration:

For iteration counter $l = 1, 2, \ldots lmax$,

Check Node Update Rule $$E^{(l)}_{n,m} = \prod_{n' \in N(m) \setminus n} \text{sgn}(T^{(l-1)}_{n',m}) \times \Phi\left(\sum_{n' \in N(m) \setminus n} \Phi(|T^{(l-1)}_{n',m}|)\right)$$

Variable Node Update Rule:

$$T_{n,m}^{(l)} = I_n + \sum_{m' \in M(n)\backslash m} E_{n,m'}^{(l)}$$

Last Variable Node Update Rule:

$$T_n^{(l)} = I_n + \sum_{m \in M(n)} E_{n,m'}^{(l)}$$

In the above equations $T_{n,m}$ is the information sent by a variable node n to its connected check node m. $E_{n,m}$ is the message passed from check node m to the connected variable node n (information given by the parity check m on bit n). M(n) is the set of check nodes connected to variable node n. N(m) is the set of variable nodes connected to check node m, $$\Phi(x) = -\log\left(\tanh\left(\frac{x}{2}\right)\right)$$

with x>0. $I_n$ is the channel Log Likelihood Ratio and can be obtained depending on the channels (for example Additive White Gaussian Noise (AWGN)). "\" is the usual exclusion symbol. 'l' indicates the iteration number with $l_{max}$ being the number of iterations. It is observed that check node computation is more complex. The nonlinear function $\Phi(x)$ is implemented using a look-up table (LUT).

However, the use of the prior art devices using the Sum-product process for decoding has a number of disadvantages which can be summarized as follows:

(i) For every iteration, the device needs to refer to a look up table.
(ii) For every iteration, the device needs to compute log likelihood ratios.
(iii) The device requires a computational means for computing log likelihood ratios.
(iv) The device requires a storage means for storing values relating to every log likelihood ratio computed.
(v) The device requires another computational means for computing Noise variance values related to every iteration.

Due to the aforementioned disadvantages, the complexity and the time required for decoding LDPC code increases considerably.

U.S. Pat. No. 7,137,060 discloses a forward error correction method for decoding coded bits generated by low density parity check matrixes. The method comprises converting each of the coded bits into a LogLikelihood Ratio value, and applying the converted values to variable nodes; delivering messages applied to the variable nodes to the check nodes, checking a message having a minimum value among the messages, and determining a sign of the message having the minimum value; receiving messages updated in the check nodes, adding up signs of the received messages and a sign of an initial message, applying a weighting factor of 1 when all signs are identical, and when all signs are not identical, updating a message of a variable node by applying a weighting factor; determining LLR value of an initial input value; and hard-deciding values of the variable nodes, performing parity check on the hard decision values, and stopping the decoding when no error occurs. The processing time required in this application is more because of the complexity and the number of calculations involved.

This invention seeks to overcome the limitations of the prior art.

OBJECTS OF THE INVENTION

An object of this invention is to provide a decoding device and system using semiparallel processing method for the decoding of LDPC codes for the WiMAX.

Another object of this invention is to obtain a reconfigurable architecture which can be used for different block lengths and different code rates as suggested in the 802.16/802.16a Standard. Another object is to provide means to obtain the inputs for the "location pointer" and "bank selector" which in turn would help us achieve the tanner graph connectivity.

Another object of this invention is to provide a system that reduces the bit error rate and the frame error rate.

Another object of this invention is to provide a system which eliminates the use of look up tables thus reducing memory requirements.

SUMMARY OF THE INVENTION

This invention envisages an error-correction system for decoding transmitted data in multichannels.

According to this invention, there is provided an error correction system for system for decoding transmitted data in multichannels.

Typically, a channel value extracting means is provided for extracting channel values from said multichannel transmitted data and relaying said channel values.

Typically, a converter means is provided for receiving said channel values and converting said channel values into data containing LogLikelihood Ratio values.

Typically, a variable node bank means is adapted to receive from said converter means, a set of LogLikelihood Ratio values and rearrange said values as items having designated parameters in discretely numbered blocks and sub-blocks to form a second data.

Typically, a bank selector means is adapted to select, in a predetermined manner, a block from said second data.

Typically, a location pointer means is adapted to select, in a predetermined manner, a sub-block from said second data.

Typically, a variable node computation means is provided having a storage means and a computation engine.

Typically, a check node computation means is provided having a storage means and a computation engine.

Typically, a switching network means is adapted to transfer, in a predetermined manner, a set of items along with their parameters between variable node bank means, variable node computation means, check node computation means, and check node bank means.

Typically, said computation engine of the check node computation means is adapted to receive said selected items and designated parameters and further adapted to compute in a predetermined manner, a first computed output containing a set of first computed items with first computed parameters.

Typically, a first comparating means is provided for comparing, in a predetermined manner, first computed parameters in relation to the designated parameters to provide a resultant output having a set of resultant items with resultant parameters for storage in the said check node computation means.

Typically, said computation engine of the variable node computation means is adapted to receive said set of resultant items with resultant parameters to compute in a predetermined manner, a second computed output having a set of second computed items with second computed parameters.

Typically, a second comparing means is adapted to compare, in a predetermined manner, for error between the second computed parameters and the designated parameters and selectively permit error free passage of items from the said variable node computation means to the said variable node bank means to form error free decoded data.

Typically, a transfer means is provided to transfer error free corrected data to receiver from said variable node bank means.

Typically, a loading means is provided to load said Log-Likelihood Ratio values serially into the variable node bank means.

Typically, a synchronization means is provided to collectively transfer data from one location to another in a timed manner.

Typically, an iterative means is adapted to repeat the entire set of computations to obtain error free decoded data.

Typically, the switching network is adapted to transfer said items parallelly from one location to another.

Typically, the switching network is adapted to transfer items, in a predetermined manner, from the variable node bank means to the variable node computation means in one clock cycle.

Typically, the switching network is adapted to transfer items, in a predetermined manner, from the variable node computation means to the check node computation means in one clock cycle.

Typically, the switching network is adapted to transfer items, in a predetermined manner, from the check node computation means to the check node bank means in multiple clock cycles.

Typically, the switching network is adapted to transfer items, in a predetermined manner, from the check node bank means to the variable node computation means in multiple clock cycles.

Typically, the designated parameter includes the address of an item. Typically, a switching network is adapted for transferring the first set of said second data within the block and sub-block into check node computation means in every cycle.

Typically, the resultant parameters of an item comprise:
i. a first minimum data value;
ii. a second minimum data value;
iii. address of first minimum data value;
iv. signs of all data values;
v. product of signs of all data values;
vi. sign of first minimum data value; and
vii. sign of second minimum data value.

Typically, said computation engine of the variable node computation means is adapted to receive the resultant parameters and is further adapted to compute the sign of each of the second computed items which forms a part of the second computed parameters.

Typically, said computation engine of the variable node computation means is adapted to receive the resultant parameters and is further adapted to compute the magnitude of each of the second computed items which forms a part of the second computed parameters.

Typically, the blocks and sub-blocks are frames and sub-frames respectively.

Typically, audio data is transmitted in blocks and sub-blocks and video data is transmitted in frames and sub-frames.

Typically, the method for error correction system for preventing loss of data during transmission comprises the following steps:
i. extracting channel values from multichannel transmitted data;
ii. converting said channel values into data containing Log-Likelihod Ratio values;
iii. loading said LogLikelihood Ratio values into a storage means;
iv. rearranging a set of LogLikelihood channel values to form items having designated parameters and storing said items having designated parameters in discretely numbered blocks and sub-blocks to form a second data;
v. selecting in a predetermined manner, items and their designated parameters in a particular sub-block of a block of said second data;
vi. computing, in a predetermined manner, using said items and their designated parameters to provide a first computed output containing a set of first computed items with first computed parameters;
vii. comparing in a predetermined manner, the first computed parameters with the designated parameters to provide a resultant output having a set of resultant items with resultant parameters;
viii. computing in a predetermined manner, using resultant items and resultant parameters to provide a second computed output having a set of second computed items with second computed parameters;
ix. comparing in a predetermined manner, the second computed parameters of the second computed output with the designated parameters to provide a set of error free decoded data;
x. selectively permitting the passage of error free decoded data to a receiver.

Typically, the LogLikelihood Ratio values is transferred serially into the said variable node bank means.

Typically, the said items are transferred parallelly from one location to another in the said error-correction system.

Typically, selection of the said block is performed by using the equation:

$$LP_C = \frac{[I - \mod(I, z)]}{z}$$

where I is the address of an item in the said variable node bank means and z is the number of blocks in the said variable node bank means.

Typically, selection of the said sub-block is performed by using the equation:

$$LP_V = \frac{[C - \mod(C, z)]}{z}$$

where C is the destination address of an item in the said check node bank means, and z is the number of blocks in the said variable node bank means.

Typically, first computed output with first computed parameters is computed by the following equation:

$$E_{n,m}^{(l)} = \prod_{n' \in N(m)\backslash n} \text{sgn}(T_{n',m}^{(l-1)}) \times \min_{n' \in N(m)\backslash n} |T_{n',m}^{(l-1)}|$$

where,
$E_{n,m}$ is the first computed output passed from the block, m, of the check node bank means to the block, n, of the connected variable node bank means, $T_{n,m}$ is the item sent from the block, n, of the variable node bank means to the block, m, of its connected check node bank means obtained by the following equations:

$$T_{n,m}^{(l)} = I_n + \sum_{m' \in M(n) \backslash m} E_{n,m'}^{(l)}$$

and $$T_n^{(l)} = I_n + \sum_{m \in M(n)} E_{n,m'}^{(l)}$$

$I_n$ is the channel LogLikelihood Ratio value.

Typically, sign of the second computed output is calculated by using the equation:

$$T_{n,m}^{(l)} = T_n^{(l)} - E_{n,m}^{(l)}$$

where, $E_{n,m}$ is the first computed output passed from the block, m, of the check node bank means to the block, n, of the connected variable node bank means, $T_{n,m}$ is the item sent from the block, n, of the variable node bank means to the block, m, of its connected check node bank means obtained by the following equations:

$$T_{n,m}^{(l)} = I_n + \sum_{m' M(n) \backslash m} E_{n,m'}^{(l)}$$

and $$T_n^{(l)} = I_n + \sum_{m \in M(n)} E_{n,m'}^{(l)}$$

$I_n$ is the channel LogLikelihood Ratio value.

Typically, the second computed means is computed in accordance with a min-sum equation.

Typically, the second computed means is computed in accordance with a min-sum equation with a weightage of 0.75.

BRIEF DESCRIPTIONS OF THE ACCOMPANYING DRAWINGS

The invention will now be described in detail with reference to a preferred embodiment. Reference to this embodiment does not limit the scope of the invention.

Figure 17:
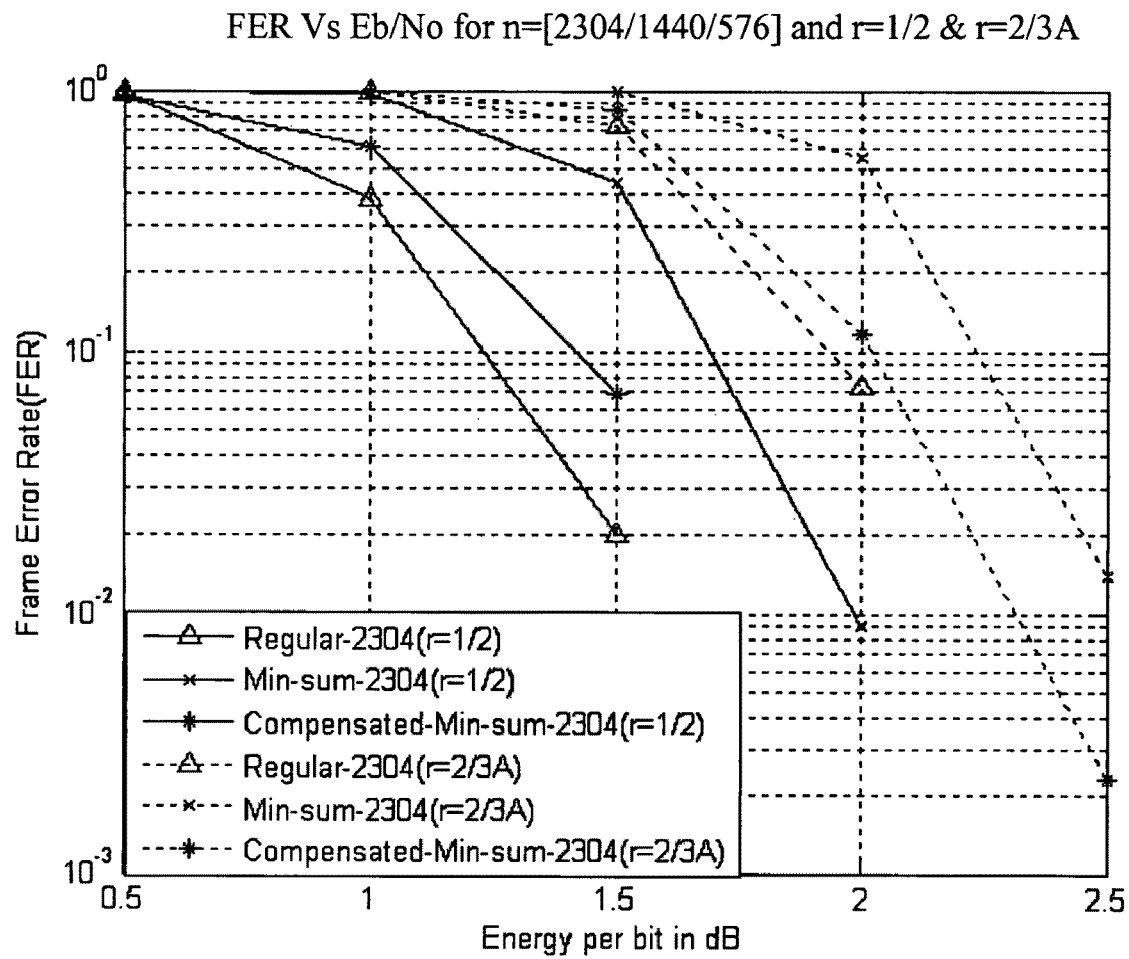
Figure 18:
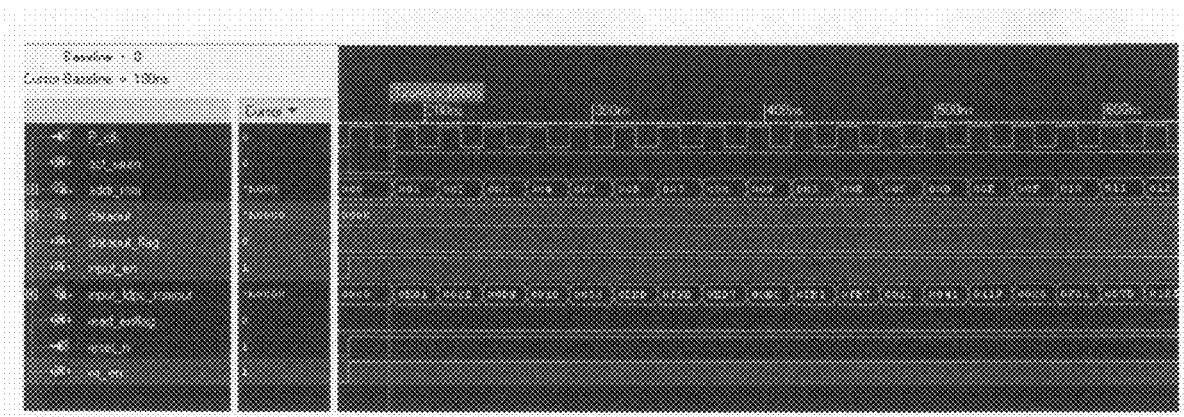
Figure 19:
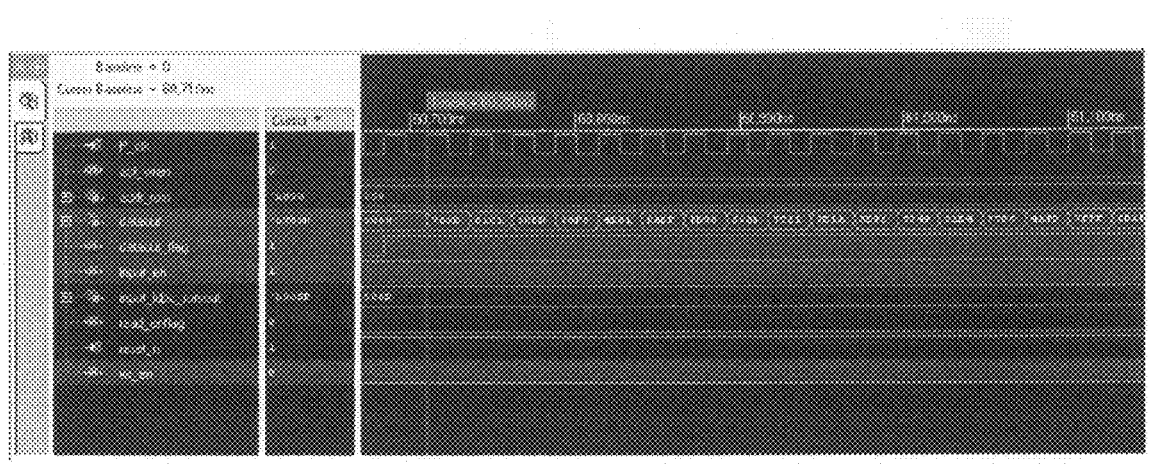

FIGS. 4 to 17 graphically illustrate a set of simulation results for the error correction system; and FIGS. 18 and 19 illustrate the Field Programmable Gate Array (FPGA) implementation of the architecture of the error correction system.

DETAILED DESCRIPTIONS OF THE ACCOMPANYING DRAWINGS

Figure 1:
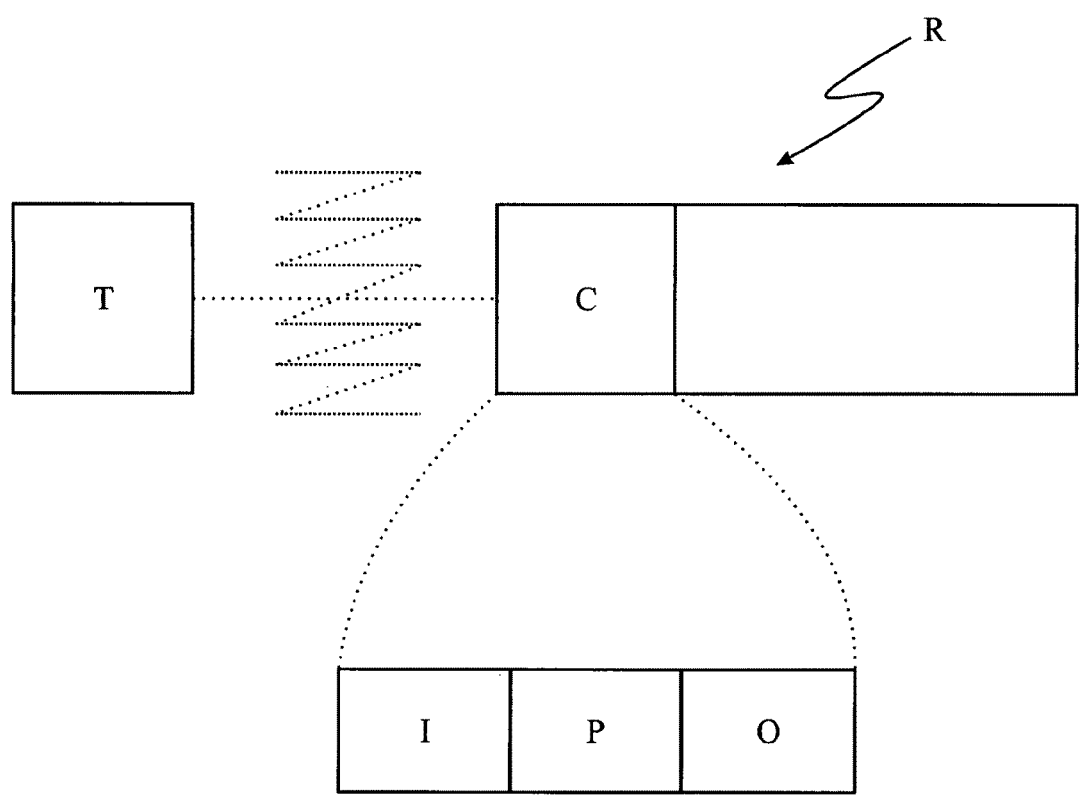
FIG. 1 illustrates a general transmission-receiving system.

FIG. 1 of the accompanying drawings illustrates a general transmitter-receiver system. An encoder at the transmitter (T) encodes the information to be transmitted. This information is passed on via a communication path to the receiver (R) where a decoding means decodes the information. An error correcting means (C) checks whether the transmitted information is same as the received information and that there has been no loss of data. The checking means comprises an input means for receiving the transmitted data, a processing means (P) for processing the data to check whether there has been any loss or change in data, and an output means (O) for passing on the data to the receiver (R).

Figure 2:
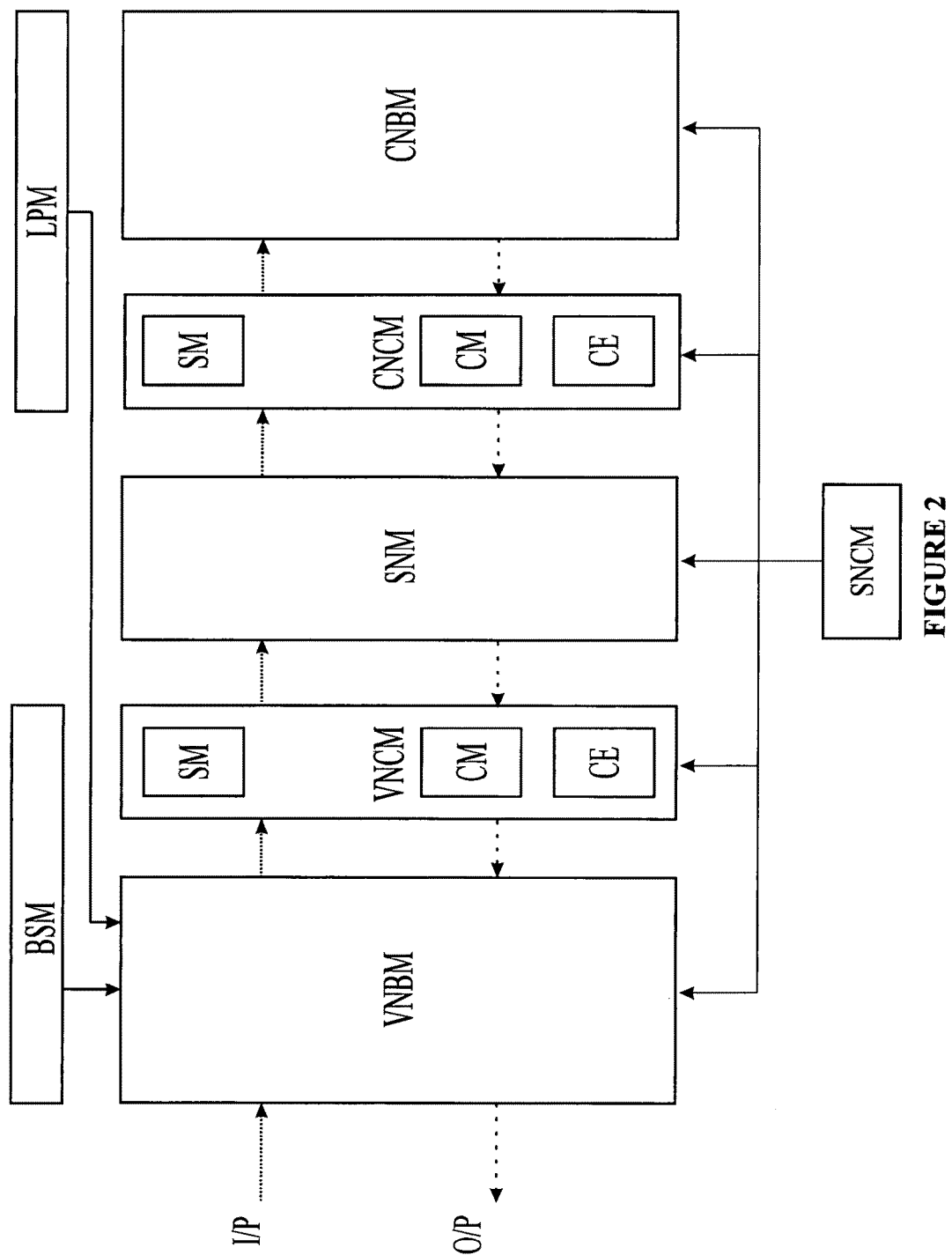
FIG. 2 illustrates a block diagram of the error correction system in accordance with this invention.

FIG. 2 of the accompanying drawings illustrates a block diagram of the error correction system in accordance with this invention. The variable node bank means (VNBM) accepts the input data in the form of LogLikelihood Ratio values and stores it in discretely numbered blocks and sub-blocks to form a second data having designated parameters before processing. The bank selector means (BSM) selects the block and the location pointer means (LPM) selects the sub-block to select an item of the data with designated parameters. The variable node computation means (VNCM) receives the selected item of the data parallelly in clock cycles from the variable node bank means (VNBM). The variable node computation means (VNCM) comprises a storage means (SM) for temporary storage of data, a computation engine (CE) to get resultant parameters for resultant data, a comparator means (CM) to compare certain parameters of the resultant data with designated parameters, for selectively permitting passage of data to the variable node bank means (VNBM). Similarly, the check node computation means (CNCM) comprises a storage means (SM) for temporary storage of data, a computation engine (CE) to get resultant parameters for resultant data, a comparator means (CM) to compare certain parameters of the resultant data with designated parameters, for permitting passage of data to the check node bank means (CNBM). A switching network transfers the data from one location to another. A synchronisation means (SNCM) is provided which collectively times the transfer of data from one location to another in the system.

Figure 3:
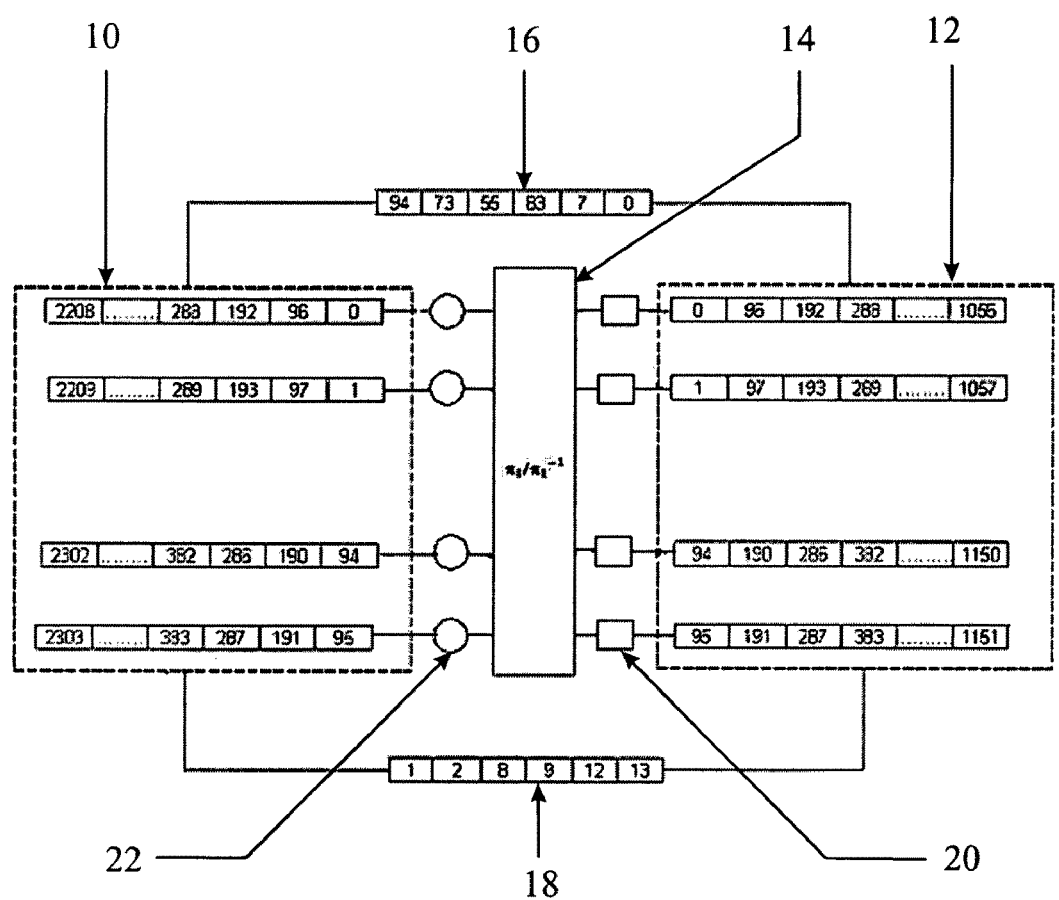
FIG. 3 illustrates the architecture for the error correction system in accordance with this invention.

FIG. 3 of the accompanying drawings illustrates the architecture for the error correction system in accordance with this invention;

The decoder shown is typically for rate ½ and block length 2304. The decoder comprises:
(i) variable node bank means (10);
(ii) check node bank means (12);
(iii) permutation/switching network means (14);
(iv) bank selector means (16);
(v) location pointer means (18);
(vi) check node computation means (20); and
(vii) variable node computation means (22).

The design is based on the cyclic behaviour of the codes. The number of memory banks and number of addresses stored in each bank would be required during the reconfigurability issue being addressed for different lengths and different rates.

The addresses of the neighbours of a check node and a variable node are related to a rate-dependent factor 'z'. Typically, for N=2304 and rate ½ a rate dependent factor with value 96 is selected. A set of z nodes starting from 0th node till z−1 node there is an increment of one in the corresponding node connected, for every set of z check nodes, the address values of the variable nodes is incremented by one. Similarly for the variable nodes for every z variable nodes the address of check nodes gets incremented by one. Typically, for rate ½, for the first set of 96 check nodes from 0th node till 95th node, the variable node addresses for 1st node are one incremented value of that of the 0th node. If the address obtained is 96, it becomes zero, if the address is 192, it becomes 96 and so on.

That is, there is a decrement of 96. Based on this observation, it is decided to use 96 elements each for VN (variable node) and CN (check node) processing in the serial-parallel architecture, with a connection mechanism to take care of the wrap around problem.

The entries shown in the memory banks are the addresses of items in the variable node means (10) and check nodes (12). Typically, 96 processing units work in parallel and fetch the inputs one-by-one based on the entries given in the bank selector means (16), which selects the bank/block and the location pointer means (18), which suggests the location of a sub-block within the selected bank/block. The number of addresses in the blocks is rate dependent. FIG. 3 of the accompanying drawings shows the addresses typically for rate ½ and block length 2304, hence, typically, there are 2304 variable nodes and 1152 check nodes. The number of entries in the location pointer means (18) and the bank selector means (16) apart from rate dependent vary during the iterative procedure. The entries shown are for the first 96 check-node processing operations; the check nodes in this set are 0, 1, 2, ..., 95 as seen in FIG. 3. For the next 96 (96, 97, ..., 191), different entries need to be loaded into these registers. To elaborate the iterative procedure further, assume that the entire block of 2304 received values is scaled to get appropriate Log Likelihood Ratios (LLRs) and are stored in banks or blocks as suggested by addresses. The check-node computational means (20) unit then starts processing. The check node computational means (20) gets six or seven values sequentially. For example, the six values for check node 0 are taken from first location of ninety fourth bank, second location of seventy third bank and the like. 96 check node computational means (20) can get the values this manner. Once the processing is completed, the check node computational unit (20) generates the same number of outputs as inputs and the outputs are put into the memory banks in the check node means (12) in the respective addresses. The processing for the next 96 check nodes can then be taken up by loading different relevant entries into the bank selector and location pointer. The inputs of the bank selector and the locations pointer are obtained from an equation of the type:

$$LP_C = \frac{[I - \mathrm{mod}(I, z)]}{z}$$

Where I is the address of the variable node connected to a particular parity check node. The entries are worked out by picking any parity-check node in the group. Further, the above equation gives the block selector value.

Once all the check-node processing is completed, the variable node processing starts 96 variable nodes are processed at a time, fetching the values from the variable node memory banks. The equation for computing location pointer values is:

$$LP_V = \frac{[C - \mathrm{mod}(C, z)]}{z}$$

where C is the check-node address and mod(C, z) is the block selector value. This completes the decoder architecture design and in implementation a controller is required to make sure that all the units are synchronized.

In order to reduce the memory requirement and LUT computations for obtaining LLRs, Min-Sum algorithm is a popular choice. Typically, in this algorithm only the check node (12) update rule differs from the regular Sum product algorithm, which is captured below Check Node Update Rule:

$$E_{n,m}^{(l)} = \prod_{n' \in N(m) \backslash n} \mathrm{sgn}(T_{n',m}^{(l-1)}) \times \min_{n' \in N(m) \backslash n} \left| T_{n',m}^{(l-1)} \right|$$

Min-Sum algorithm are useful have the following characteristics:

(a) Check node (12) update is replaced by a selection of the minimum input value.
(b) Only two magnitudes need to be saved for each parity check equation. (c) No need to estimate the noise variance to compute the intrinsic information.

The simplicity of Min-Sum is associated with a performance penalty in terms of bit error rate. It is known that the performance penalty is due to over estimation of extrinsic information (compared to the regular Sum-Product and hence compensation in terms of subtraction (offset) or multiplication (normalized) is suggested. Based on the extensive simulation studies carried out in accordance with this invention, it was found that a factor of 0.75 multiplication of the variable node outputs result in performance of the (compensated) min-sum algorithm close to that of the regular sum-product algorithm. This factor can be simply implemented in the VCUs (22) by multiplying the output by 0.5 and 0.25 (both are shift operations) and adding the results to get the compensated values.

The semi-parallel implementation of the Min-Sum algorithm in the proposed decoder comprises the following steps:

Step 1: A channel value extracting means extracts channel values from the multichannel transmitted data and relays the channel values to a converter means. the converter means converts said channel values into data containing LogLikelihood Ratio values. A variable node bank means (10) is adapted to receive from said converter means, a set of Log-Likelihood Ratio values and it rearranges the said values as items having designated parameters in discretely numbered blocks and sub-blocks to form a second data. This step is serial processing.

Step 2: A bank selector means (16) is adapted to select, in a predetermined manner, a block from said second data, and a location pointer means (18) is adapted to select, in a predetermined manner, a sub-block from said second data resident in the variable node memory bank means (10) that are connected to the check node memory bank means (12) which are under updation. Since, typically 96 separate memory banks are present, parallelly 96 values can be fetched and are given as input to switching network (14).

Step 3: Switching network (14) takes values from all the 96 variable node memory banks (10) and performs proper shifting operation depending on the addresses of the variable nodes (10) that are connected to check nodes (12) those are under updation. Switching is done parallelly on 96 input values and within a clock cycle it gives shifted version of its input values. Switching network (14) output (96 values which are nothing but shifted version of 96 input values) is given to 96 check node functional units (20).

Step 4: The computation engine of the check node computation means (20) is adapted to receive selected items and designated parameters and further adapted to compute, in a predetermined manner, a first computed output containing a set of first computed items with first computed parameters. A first comparator means is provided for comparing, in a predetermined manner, first computed parameters in relation to the designated parameters to provide a resultant output having a set of resultant items with resultant parameters for storage in said check node computation means (12).

Each check node functional unit (20) takes one input value at every clock cycle and performs computation. If degree of check node (12) which is under updation is "k" then check node functional unit (20) takes "k" clock cycles to give its output. Each input value for individual functional unit is given sequentially. Since 96 functional units are available, 96 outputs of all functional units can be obtained in "k" clock cycles. Output of each functional unit consists of first minimum among its inputs, second minimum among its inputs, first minimum address, signs of all input values and product of signs of all input values.

Check node computational means (20) takes one input at a time sequentially in each clock cycle. Each value is $T_n$. Each check node computational means (20) fetches "k" number of $T_n$ values from variable node (10) memory banks (each in one clock cycle) and one entire relevant check node (12) value which consists of first minimum(min 1), second minimum (min2), first minimum address(min1address), signs of all input values and product of signs of all input values. These can be used to generate $E_{n,m}$ values as follows.

The check node computational unit (20) compares min1address with the variable node (10) address from which current $T_n$ value has been fetched. If it is matched, then min2 is actual magnitude of $E_{n,m}$ otherwise min1 is considered as actual magnitude. The sign of it is obtained by multiplying the overall sign with the sign information of previous iteration. With this it finds +min1 or −min1 or +min2 or −min2. To start with all the check node (12) memory bank values are initialized to zeros (zero corresponds to positive sign). Separate buses are provided to check node functional unit (20) for fetching $T_n$ and $E_{n,m}$ values from variable node (10) and check node (12) memory banks respectively. So both $T_n$ and $E_{n,m}$ can be fetched parallelly. At each clock cycle $E_{n,m}$ value is subtracted from $T_n$ to get $T_{n,m}$:

$$T_{n,m} = T_n - E_{n,m}$$

Step 5: Outputs of all 96 functional units are written parallelly into 96 check node (12) memory banks. This completes the updation of one set of 96 check nodes (12). These 96 check node functional units (20) will be repeatedly operated for 12 times to complete updation of 12 sets of 96 check nodes (12*96=1152), completing the check node (12) processing (first half iteration). It takes at most k*12 clock cycles.

Step 6: After completion of check node (12) processing, the next step is to fetch values from check node (12) memory banks, which are required for variable node (10) processing.

The computation engine of the variable node computation means (22) is adapted to receive a set of resultant items with resultant parameters to compute, in a predetermined manner, a second computed output having a set of second computed items with second computed parameters. A second comparator means is adapted to compare, in a predetermined manner, for error between the second computed parameters and the designated parameters and selectively permit error free passage of items from the said variable node computation means (22) to the said variable node bank means (10) to form error free decoded data.

Similar to check node (12) processing, in variable node (10) processing also, 96 values are fetched parallelly from 96 check node memory (12) banks and are given to switching network means (14).

Step 7: The outputs of switching network (14) (shifted version of input values) are given to variable node functional units (22).

Step 8: Each individual variable node functional unit (22) takes each input sequentially and performs computation and gives the output in "x" number of clock cycles, if "x" is the degree of variable node that is under updation.

Variable node functional unit (22) takes "x" number of input values from check node (12) memory banks sequentially (one at a time). It derives +min1 or −min1 or +min2 or −min2 from check node (12) memory values in the same way as explained in check node (12) processing. i.e. variable node (10) processor compares min1addr with the variable node (10) address which is under updation. If it matches, magnitude of $E_{n,m}$ is considered as min2 otherwise min1. The sign of $E_{n,m}$ is obtained by multiplying the overall sign with its relevant individual sign information in the check node (12) memory. The obtained $E_{n,m}$ values are accumulated with the intrinsic information of that variable node (10) and result is stored in variable node (10) memory bank. Writing the result of variable node functional unit (22) into the corresponding variable node (10) memory location represents the updation of that particular variable node (10).

Step 9: Since 96 such functional units are there in the architecture, outputs of all 96 variable node functional units (22) are written parallelly into 96 variable node (10) memory banks.

Step 10: These 96 functional units are operated typically for 24 times to complete variable node (10) processing (second half iteration).

Step 11: This check node (12) processing and variable node (10) processing is repeated for maximum number of iterations FIGS. 4 to 17 graphically illustrate a set of simulation results.

The simulation study has been carried out for block lengths 576, 1440, and 2304 (lowest, intermediate and maximum in the standard) as well as for rates ½, ⅔ and ¾. Some typical simulation results showing both the bit error rate (BER) and frame error rate (FER) are plotted against energy per bit, $E_b/N_0$, for AWGN case, the results are for all-zero code word. The results confirmed the facts i.e. performance improves as the frame length increases for a given rate and for a given length performance improves with the decrease in rate. For λ-Min algorithm the value of λ is chosen as 3. It was observed that both the λ-Min and A-Min*algorithms performed close to the regular sum-product algorithm, but with more complexity than Min-Sum. The Min-Sum algorithm had some performance penalty of about 0.5 dB. If the compensation factor of 0.75 is used, as mentioned earlier, the performance of Min-Sum algorithm can be brought closer to the regular BP algorithm as seen in FIGS. 13,14,15,16 of the accompanying drawings. Similar results were observed with randomly generated codewords.

Figure 4:
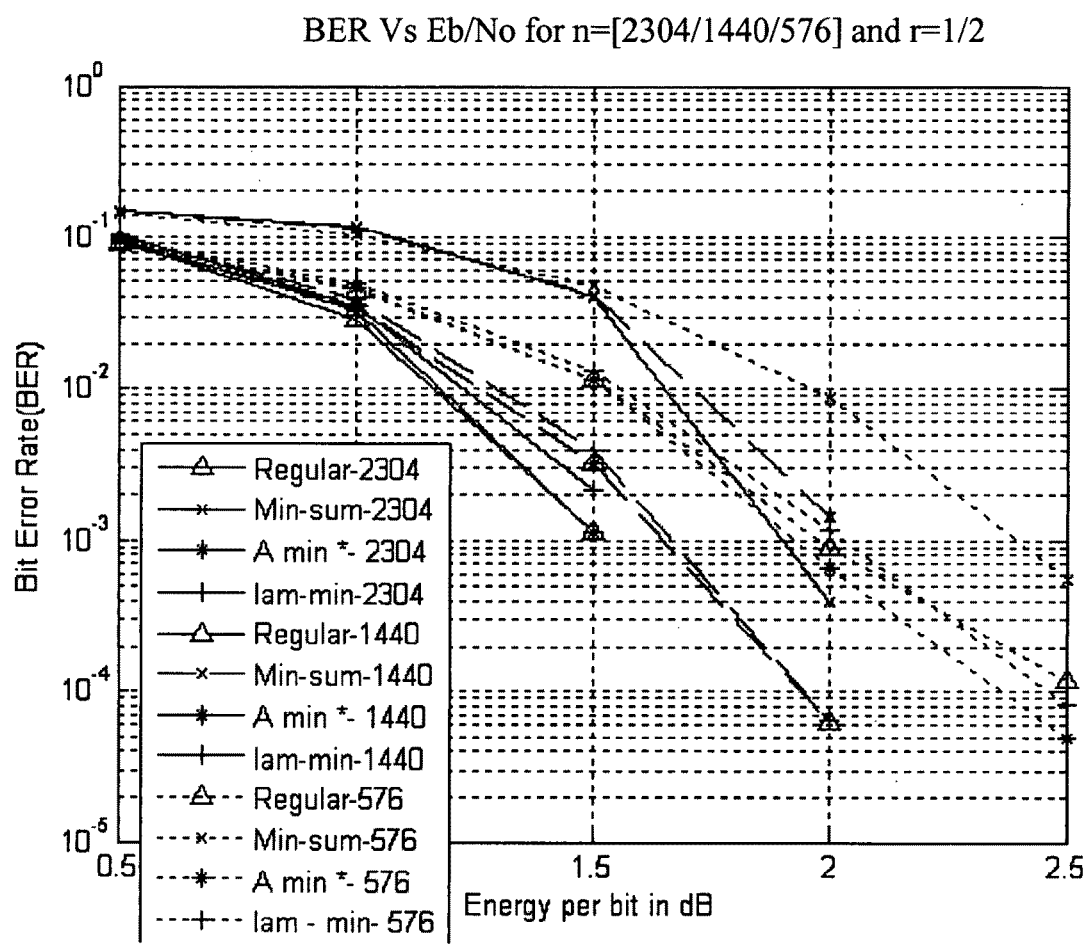
Figure 5:
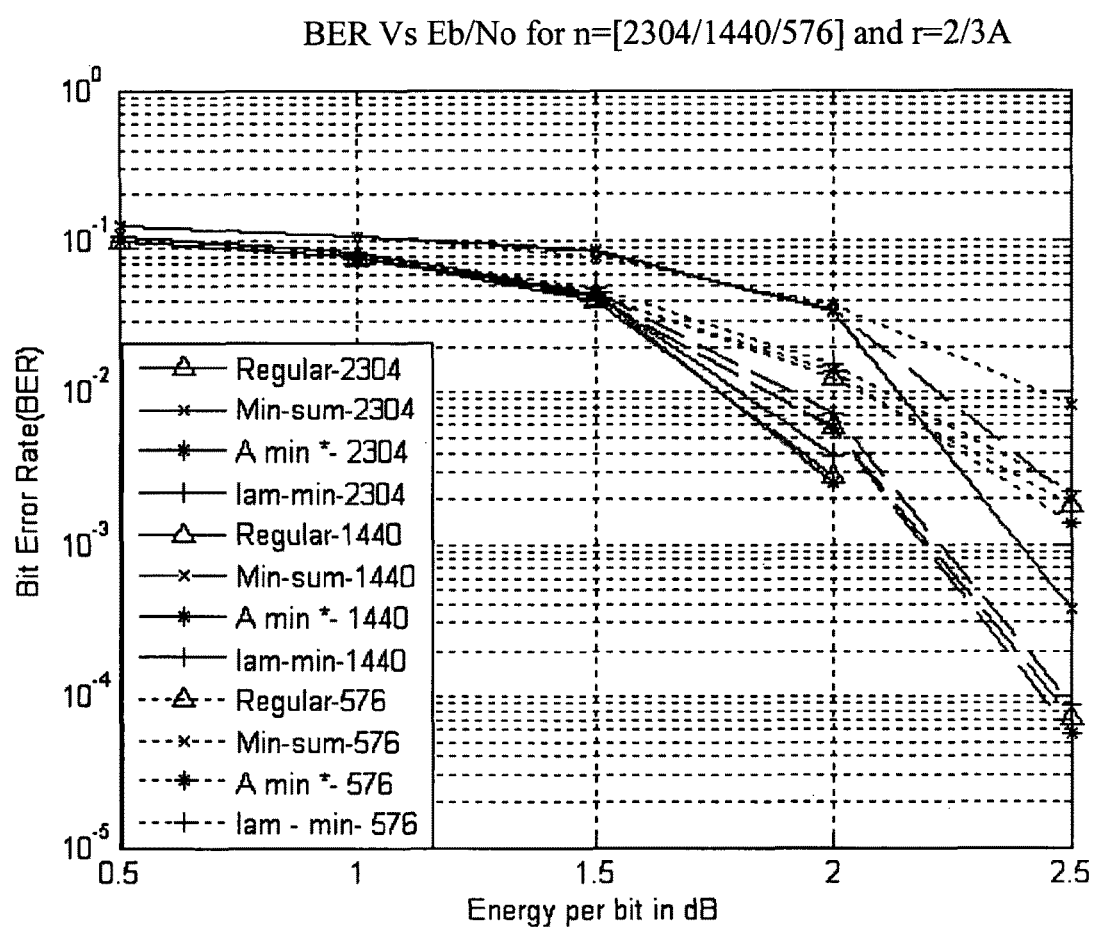
Figure 6:
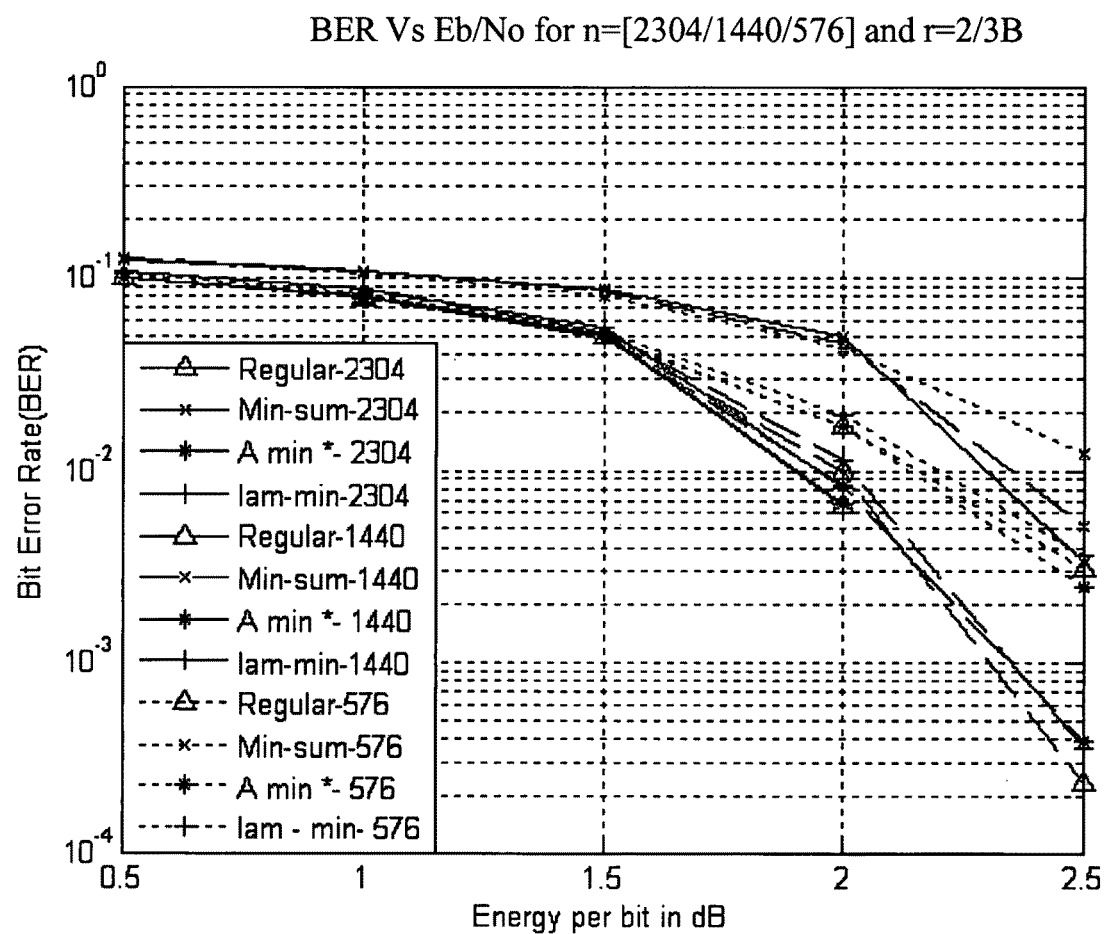
Figure 7:
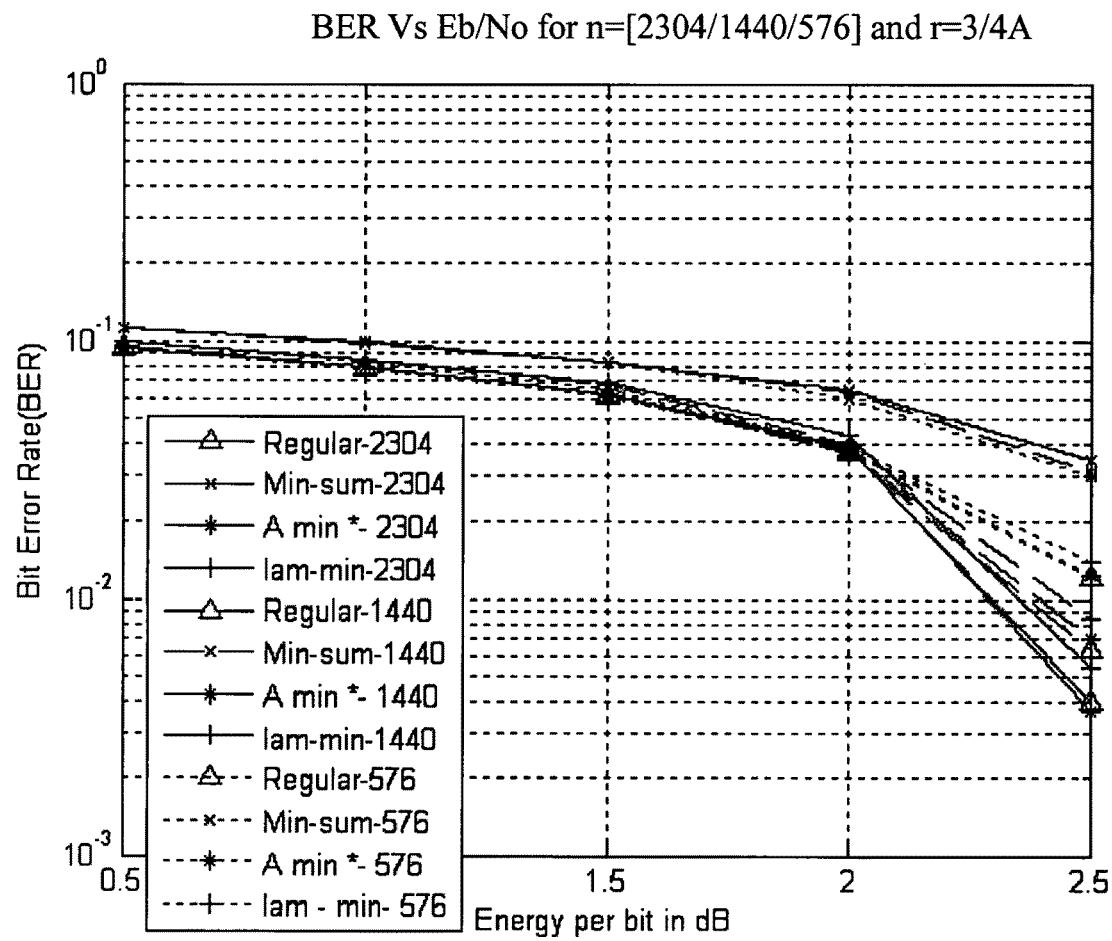
Figure 8:
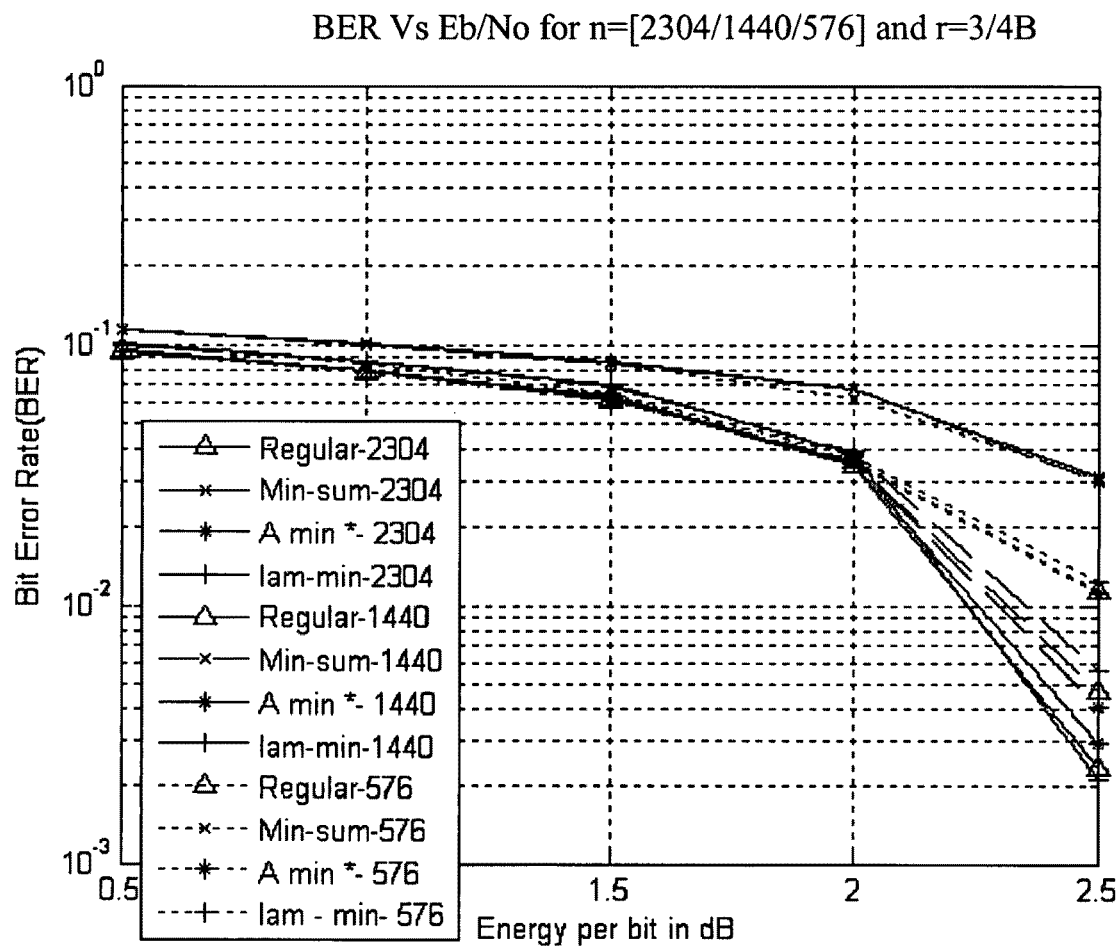
Figure 9:
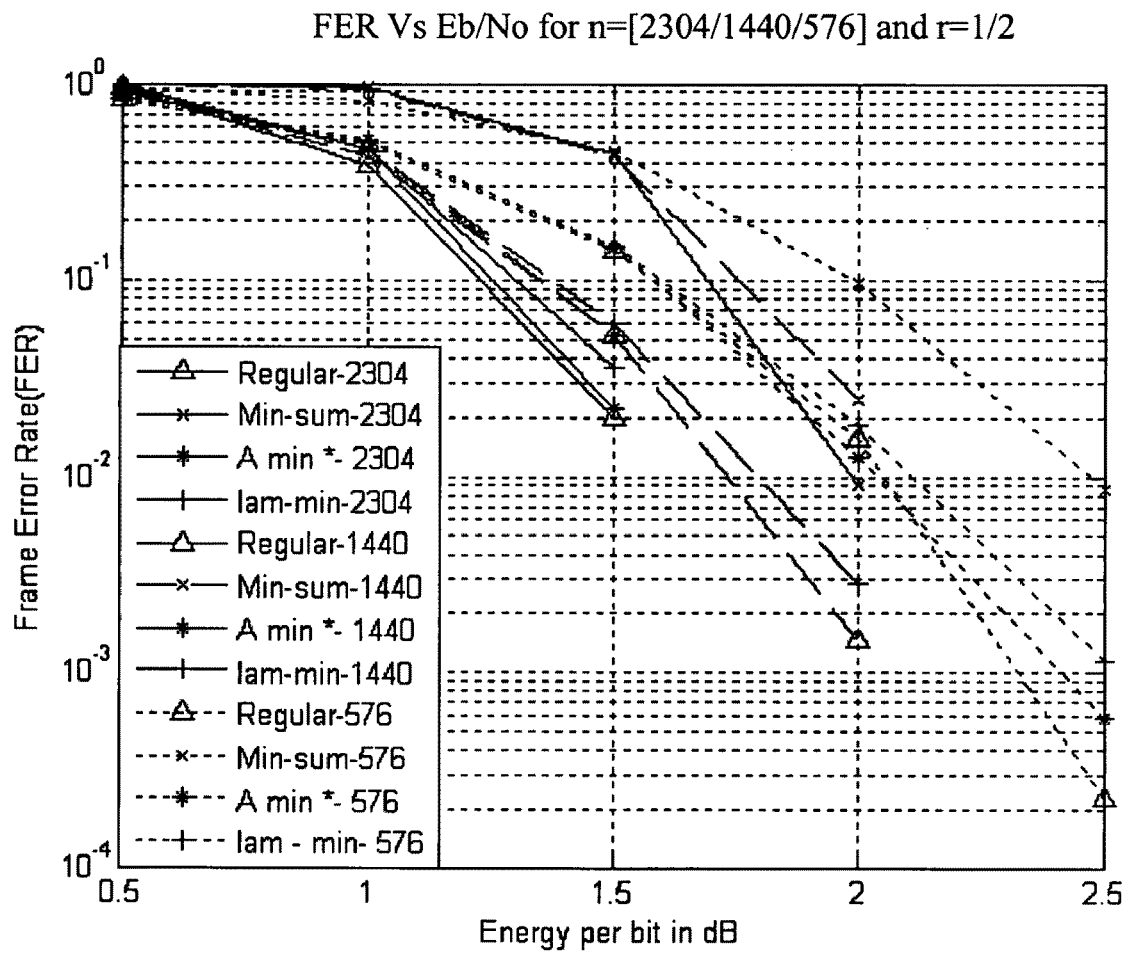
Figure 10:
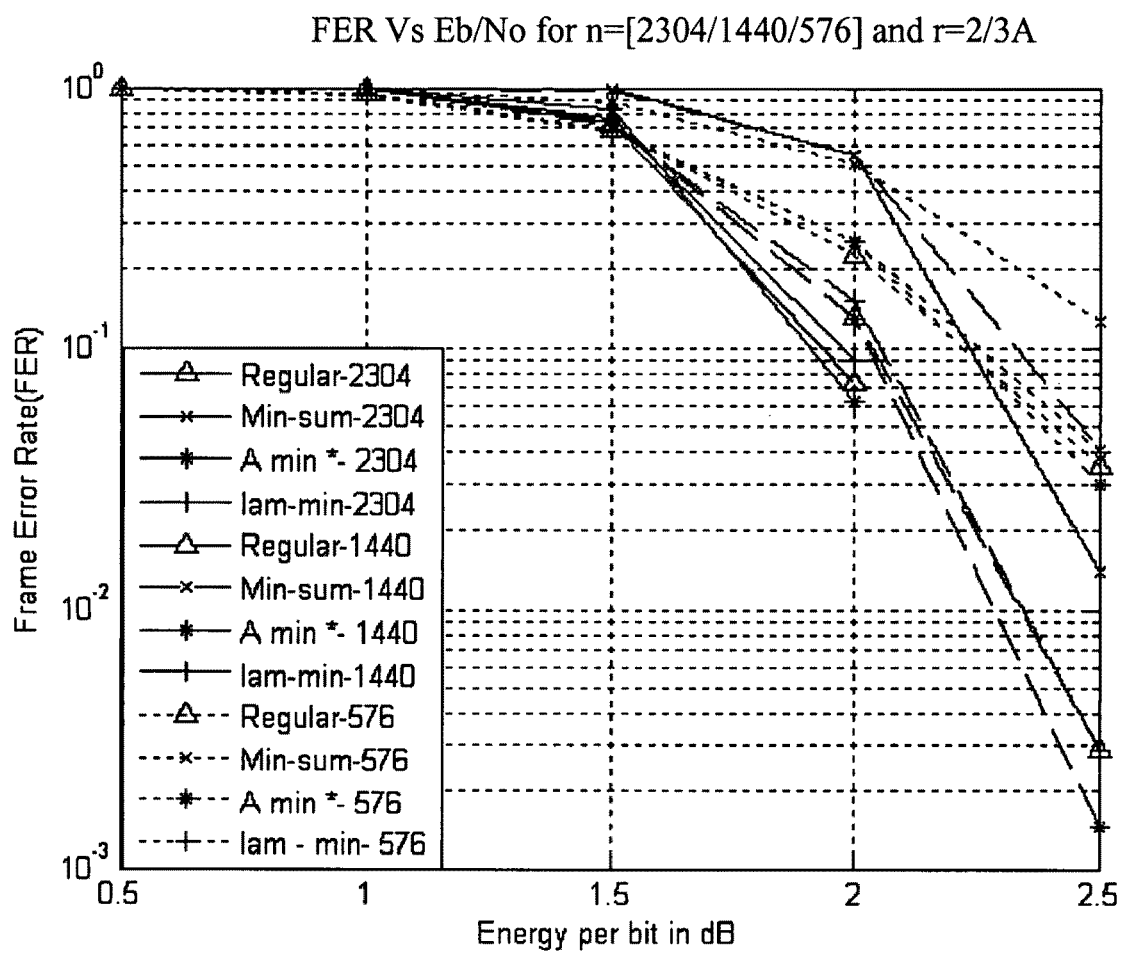
Figure 11:
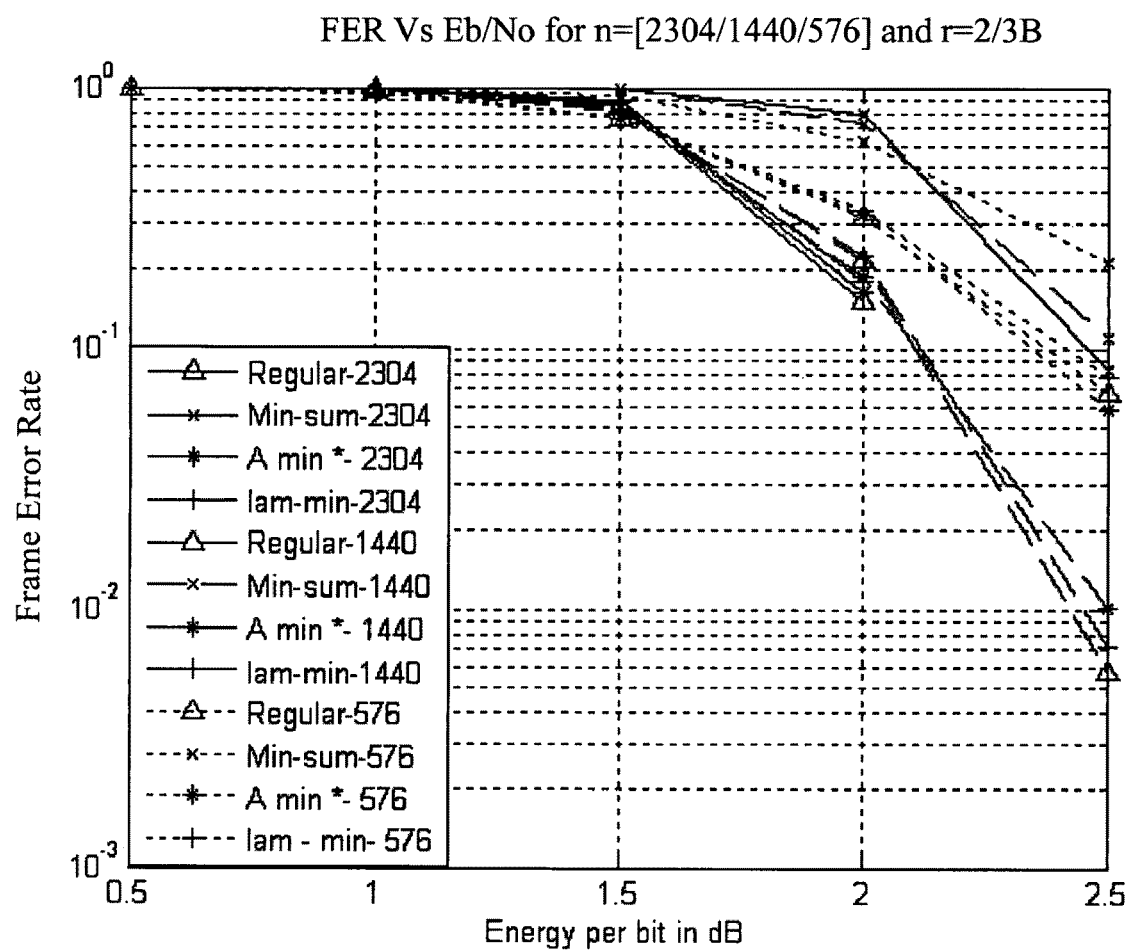
Figure 12:
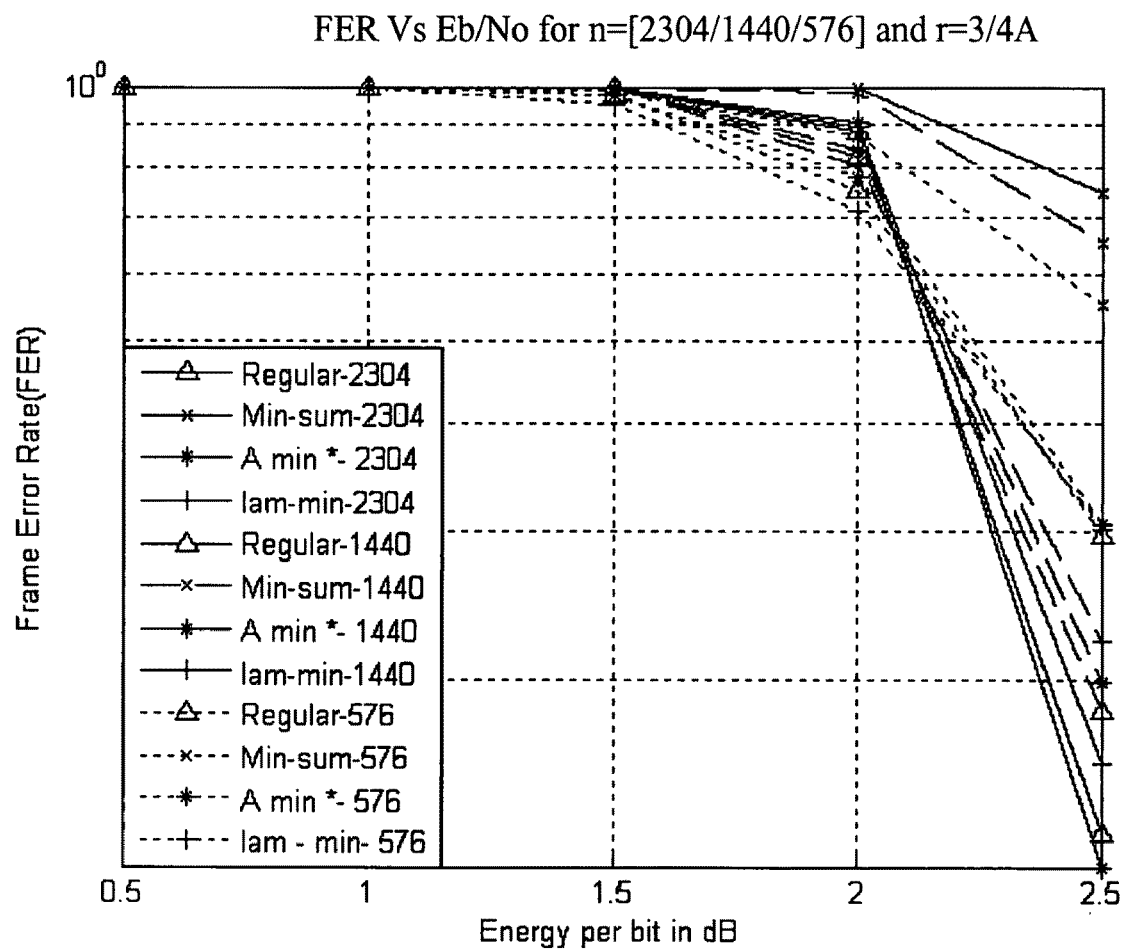
Figure 13:
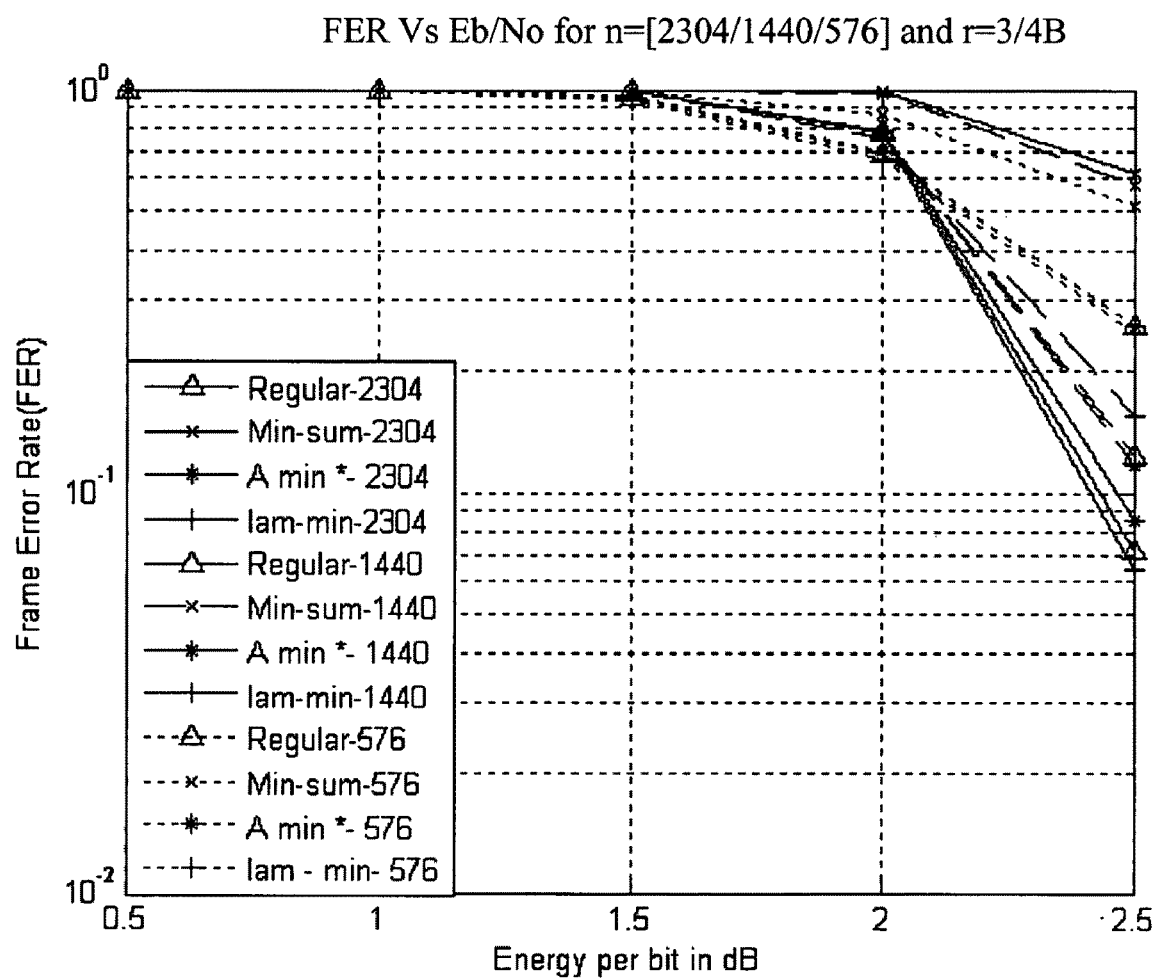
Figure 14:
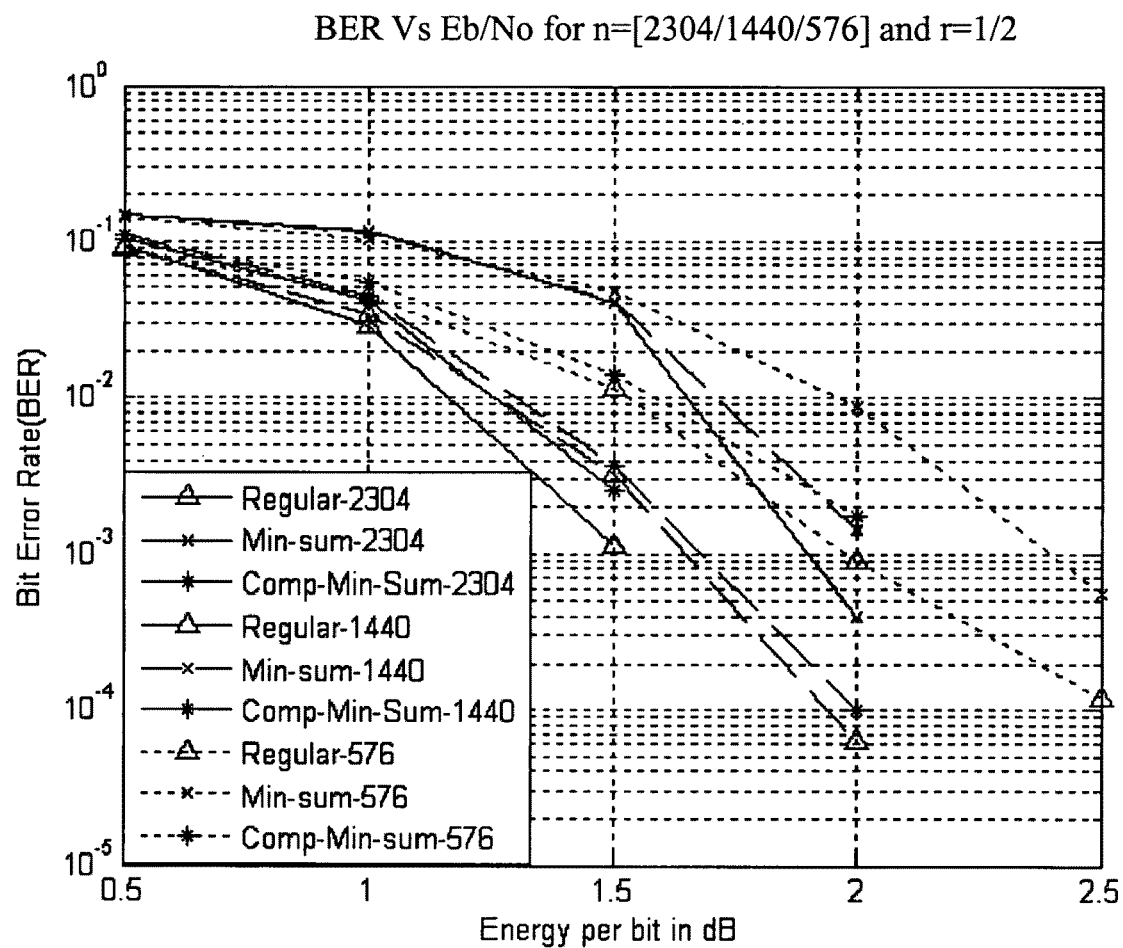
Figure 15:
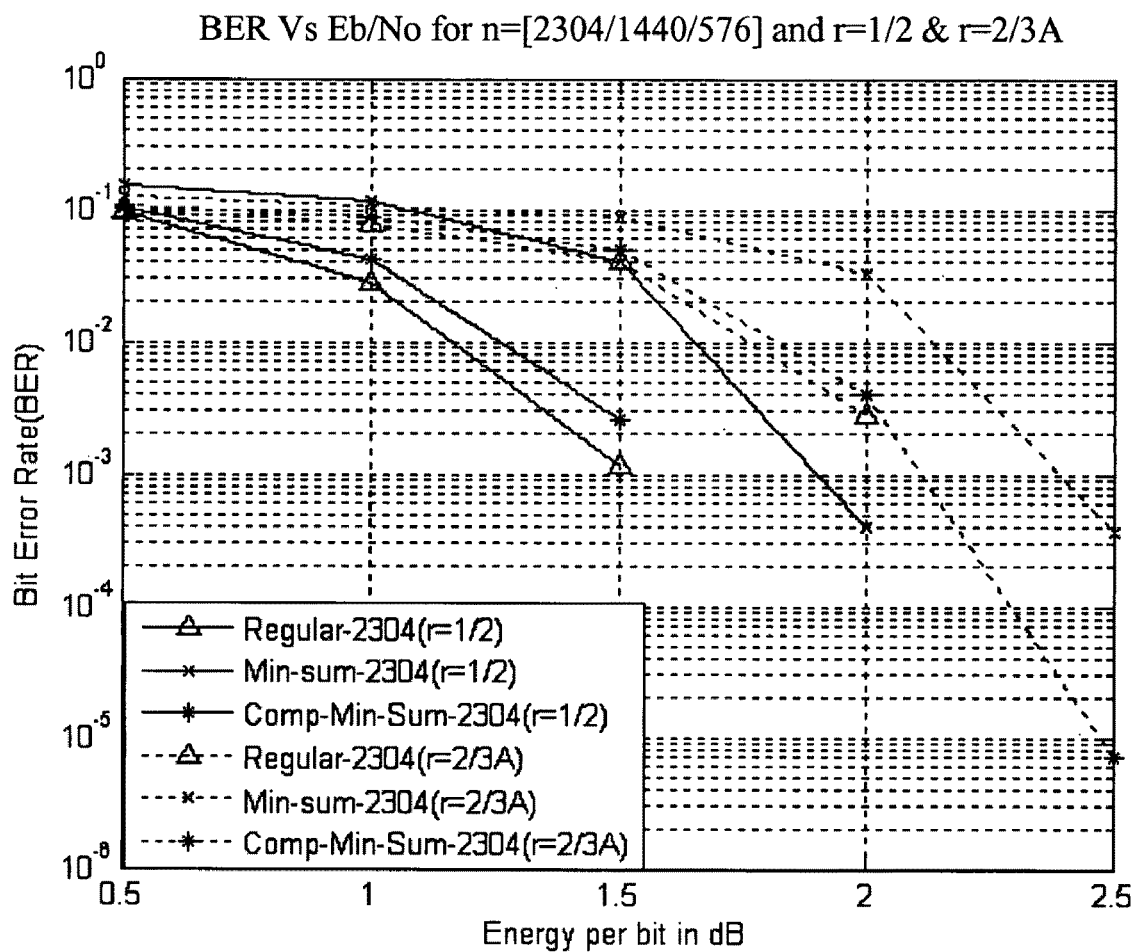
Figure 16:
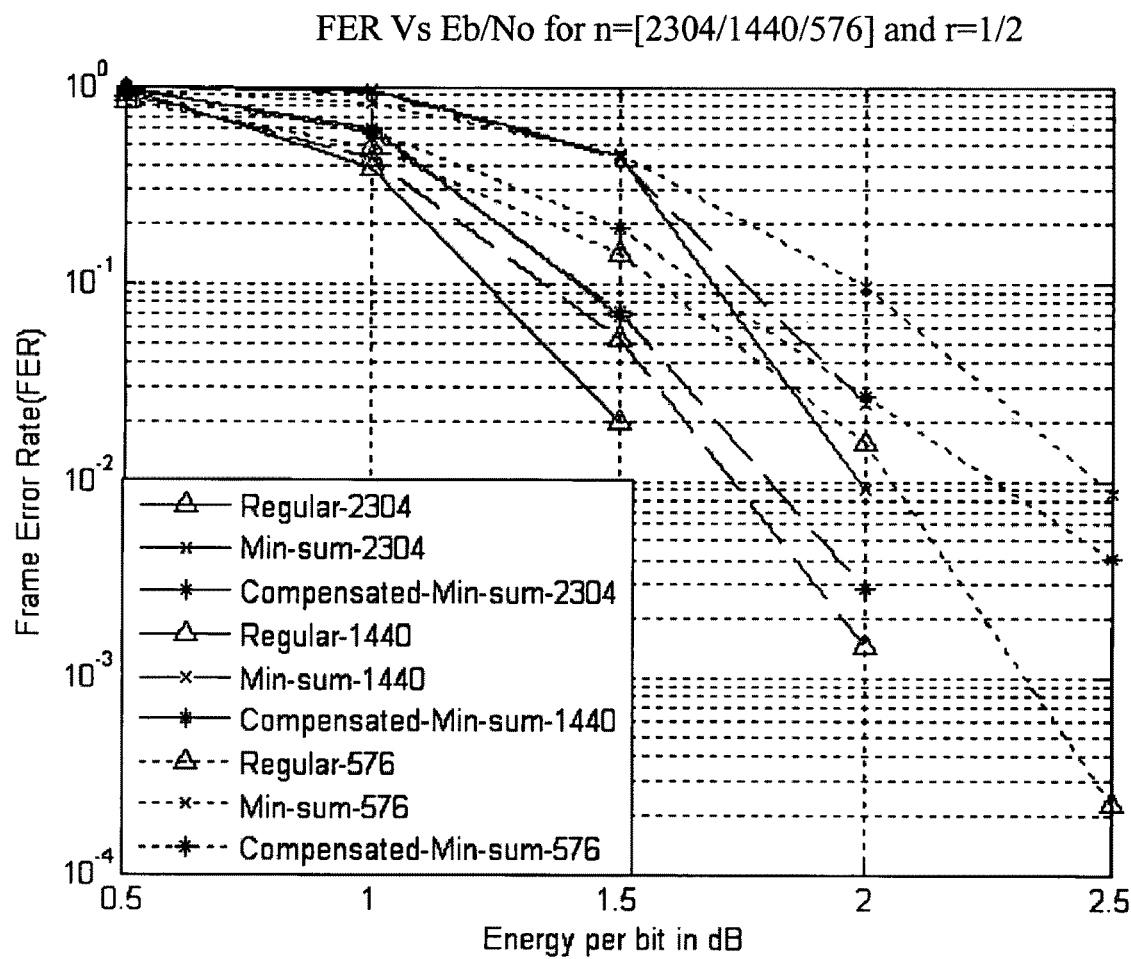

FIG. 4 illustrates a graph of Bit Error Rate (BER) Vs Energy per Bit in dB (Eb/No) for block length, n=[2304/1440/576] and rate, r=½ (typically in Mbps);

FIG. 5 illustrates a graph of Bit Error Rate (BER) Vs Energy per Bit in dB (Eb/No) for block length, n=[2304/1440/576] and rate, r=⅔A (typically in Mbps), where A is the first weighting factor;

FIG. 6 illustrates a graph of Bit Error Rate (BER) Vs Energy per Bit in dB (Eb/No) for block length, n=[2304/1440/576] and rate, r=⅔B (typically in Mbps) where B is the second weighting factor;

FIG. 7 illustrates a graph of Bit Error Rate (BER) Vs Energy per Bit in dB (Eb/No) for block length, n=[2304/1440/576] and rate, r=¾A (typically in Mbps) where A is the first weighting factor;

FIG. 8 illustrates a graph of Bit Error Rate (BER) Vs Energy per Bit in dB (Eb/No) for block length, n=[2304/1440/576] and rate, r=¾B (typically in Mbps) where B is the second weighting factor;

FIG. 9 illustrates a graph of Frame Error Rate (FER) Vs Energy per Bit in dB (Eb/No) for block length, n=[2304/1440/576] and rate, r=½ (typically in Mbps);

FIG. 10 illustrates a graph of Frame Error Rate (FER) Vs Energy per Bit in dB (Eb/No) for block length, n=[2304/1440/576] and rate, r=⅔A (typically in Mbps) where A is the first weighting factor;

FIG. 11 illustrates a graph of Frame Error Rate (FER) Vs Energy per Bit in dB (Eb/No) for block length, n=[2304/1440/576] and rate, r=⅔B (typically in Mbps) where B is the second weighting factor;

FIG. 12 illustrates a graph of Frame Error Rate (FER) Vs Energy per Bit in dB (Eb/No) for block length, n=[2304/1440/576] and rate, r=¾A (typically in Mbps) where A is the first weighting factor;

FIG. 13 illustrates a graph of Frame Error Rate (FER) Vs Energy per Bit in dB (Eb/No) for block length, n=[2304 1440 576] and rate, r=¾B (typically in Mbps) where B is the second weighting factor;

FIG. 14 illustrates a graph of Bit Error Rate (BER) Vs Energy per Bit in dB (Eb/No) for block length, n=[2304/1440/576] and rate, r=½ (typically in Mbps);

FIG. 15 illustrates a graph of Bit Error Rate (BER) Vs Energy per Bit in dB (Eb/No) for block length, n=[2304] and rates, r=½ & r=⅔A (typically in Mbps) where A is the first weighting factor;

FIG. 16 illustrates a graph of Frame Error Rate (FER) Vs Energy per Bit in dB (Eb/No) for block length, n=[2304/1440/576] and rate, r=½ (typically in Mbps);

FIG. 17 illustrates a graph of Frame Error Rate (FER) Vs Energy per Bit in dB (Eb/No) for block length, n=[2304] and rates, r=½ & ⅔A (typically in Mbps) where A is the first weighting factor;

FIGS. 18 and 19 of the accompanying drawings illustrate the Field Programmable Gate Array (FPGA) Implementation of the Novel Architecture.

The waveforms relevant to functional verification simulation are shown in FIG. 18 and FIG. 19, wherein FIG. 18 illustrates Input Waveforms and FIG. 19 illustrates Output Waveforms (after 10 Iterations). The waveforms are for $E_b/N_0$ of 3.5 dB with 16 bits quantization (1 sign bit, 4 integer bits and 11 fractional bits).

An FPGA implementation of the novel architecture is carried out for the case of frame length 576 and code rate ½. The decoding algorithm used was the compensated Min-Sum algorithm. The following Table gives the details of the Target device (FPGA) which was used in the laboratory.

| Target Device | xc2v6000 |
|---|---|
| Target Package | ff1152 |
| Target Speed | −6 |

The check-node portion of the decoder architecture comprises of the check-node RAM and Check-node processors (computational units). Similarly, the variable-node portion comprises the variable-node RAM and the variable-node processors.

Check node values, which are updated by check node processors, are stored in the check-node RAM. This memory block stores the information about the check node values (such as min1, min2, min1addr and sign bits). Check node RAM also consists of memory bank, the depth of which depends on the code rate. The check node processors fetch their input values parallely from variable node memory bank and perform the operation on them. The results of all these processors are stored in Check node RAM parallely. Location pointer and Bank selector values are given to each and every processor whose values are used during the computation. Switching network, its main component in the implementation being barrel shifter, takes care of the connections between RAMs and processing elements. Location Pointer entries (addresses) are used to fetch the values from memory banks and those fetched values are given as the inputs to the switching network. Contents of bank selector are given as input to the selection bits of multiplexers of barrel shifter. Depending on the address given to selection bits of barrel shifter, the shifting operation will be done accordingly and the result of shifted input information of barrel shifter will be stored in output latches of switching network.

Variable node RAM consists of memory banks whose depth depends on the code block length. The port bus from each of the banks is connected to switching network. Data that is to be fetched from an individual memory bank is dependent on the Location Pointer value. Initially before the start of decoding process, the memory banks are loaded with channel values. After the commencement of decoding process these are loaded with results obtained by variable node processors. The interfacing description of Variable node processors is very much similar to Check node processors.

In the following, few details about resource utilization (on FPGA) and timing are provided.

Resource Utilization:

Total equivalent gate count for design: U.S. Pat. No. 5,715,703

The following Table gives the Resource Utilization summary of the design on FPGA.

| Number of Slice Flip Flops | 15,348 out of 67,584 | 22% |
|---|---|---|
| Number of 4 input LUTs | 31,755 out of 67,584 | 46% |
| Number of occupied Slices | 16,813 out of 33,792 | 49% |
| Number of bonded IOBs | 30 out of 824 | 3% |
| Number of Block RAMs | 82 out of 144 | 56% |
| Number of GCLKs | 1 out of 16 | 6% |

Timing Summary:

Minimum period: 8.127 ns

Minimum input arrival time before clock: 7.888 ns

Maximum output required time after clock: 4.961 ns

Maximum combinational path delay: 2.485 ns

The Maximum Frequency of operation of the design is found to be 123.047 Mhz

While considerable emphasis has been placed herein on the various components of the preferred embodiment, it will be appreciated that many alterations can be made and that many modifications can be made in the preferred embodiment without departing from the principles of the invention. These and other changes in the preferred embodiment as well as other embodiments of the invention will be apparent to those skilled in the art from the disclosure herein, whereby it is to be distinctly understood that the foregoing descriptive matter is to be interpreted merely as illustrative of the invention and not as a limitation.

The invention claimed is:

1. An error correction system for decoding transmitted data in multichannels, said system comprising the following:
   i. a channel value extracting means for extracting channel values from said multichannel transmitted data and relaying said channel values;
   ii. a converter means for receiving said channel values and converting said channel values into data containing Log-Likelihood Ratio values;
   iii. a variable node bank means adapted to receive from said converter means, a set of LogLikelihood Ratio values and rearrange said values as items having designated parameters in discretely numbered blocks and sub-blocks to form a second data;
   iv. a bank selector means adapted to select, in a predetermined manner, a block from said second data,
   v. a location pointer means adapted to select, in a predetermined manner, a sub-block from said second data;
   vi. a variable node computation means having a storage means and a computation engine;
   vii. a check node computation means having a storage means and a computation engine;
   viii. a switching network means adapted to transfer, in a predetermined manner, a set of items along with their parameters between variable node bank means, variable node computation means, check node computation means, and check node bank means;
   ix. said computation engine of the check node computation means adapted to receive said selected items and designated parameters and further adapted to compute, in a predetermined manner, a first computed output containing a set of first computed items with first computed parameters;
   x. a first comparing means for comparing, in a predetermined manner, first computed parameters in relation to the designated parameters to provide a resultant output having a set of resultant items with resultant parameters for storage in said check node computation means;
   xi. said computation engine of the variable node computation means adapted to receive said set of resultant items with resultant parameters to compute, in a predetermined manner, a second computed output having a set of second computed items with second computed parameters;
   xii. second comparing means adapted to compare, in a predetermined manner, for error between the second computed parameters and the designated parameters and selectively permit passage of error free items from the said variable node computation means to the said variable node bank means to form error free decoded data;
   xiii. transfer means to transfer error free decoded data to a receiver from said variable node bank means.

2. The error correction system as claimed in claim 1 wherein, a loading means is provided to load said LogLikelihood Ratio values serially into the variable node bank means.

3. The error correction system as claimed in claim 1 wherein, a synchronization means is provided to collectively transfer items from one location to another in a timed manner.

4. The error correction system as claimed in claim 1 wherein, an iterative means is adapted to repeat the entire set of computations to obtain error free decoded data.

5. The error correction system as claimed in claim 1 wherein, the switching network is adapted to transfer said items parallelly from one location to another.

6. The error correction system as claimed in claim 1 wherein, the switching network is adapted to transfer items, in a predetermined manner, from the variable node bank means to the variable node computation means in one clock cycle.

7. The error correction system as claimed in claim 1 wherein, the switching network is adapted to transfer items, in a predetermined manner, from the variable node computation means to the check node computation means in one clock cycle.

8. The error correction system as claimed in claim 1 wherein, the switching network is adapted to transfer items, in a predetermined manner, from the check node computation means to the check node bank means in multiple clock cycles.

9. The error correction system as claimed in claim 1 wherein, the switching network is adapted to transfer items, in a predetermined manner, from the check node bank means to the variable node computation means in multiple clock cycles.

10. The error correction system as claimed in claim 1 wherein, the designated parameter includes the address of an item.

11. The error correction system as claimed in claim 1 wherein, a switching network is adapted for transferring the first set of said second data within the block and sub-block into check node computation means in every cycle.

12. The error correction system as claimed in claim 1 wherein, the said resultant parameters of an item comprise:
    i) a first minimum data value;
    ii) a second minimum data value;
    iii) address of first minimum data value;
    iv) signs of all data values;
    v) product of signs of all data values;
    vi) sign of first minimum data value; and
    viii) sign of second minimum data value.

13. The error correction system as claimed in claim 12 wherein, the said computation engine of the variable node computation means is adapted to receive the resultant parameters and is further adapted to compute the sign of each of the second computed items which forms a part of the second computed parameters.

14. The error correction system as claimed in claim 1 wherein, the said computation engine of the variable node computation means is adapted to receive the resultant parameters and is further adapted to compute the magnitude of each of the second computed items which forms a part of the second computed parameters.

15. The error correction system as claimed in claim 1 wherein, said blocks and said sub-blocks are frames and sub-frames respectively.

16. A method of error correction for decoding transmitted data in multichannels, said method comprising the following steps:
    i. extracting channel values from multichannel transmitted data;
    ii. converting said channel values into data containing Log-Likelihood Ratio values;
    iii. loading said LogLikelihood Ratio values into a storage means;
    iv. rearranging said LogLikelihood Ratio values to form items having designated parameters and storing said items having designated parameters in discretely numbered blocks and sub-blocks to form a second data;
    v. selecting in a predetermined manner, items and their designated parameters in a particular sub-block of a block of said second data;
    vi. computing, in a predetermined manner, using said items and their designated parameters to provide a first computed output containing a set of first computed items with first computed parameters;

vii. comparing in a predetermined manner, the first computed parameters with the designated parameters to provide a resultant output having a set of resultant items with resultant parameters;

viii. computing in a predetermined manner, using resultant items and resultant parameters to provide a second computed output having a set of second computed items with second computed parameters;

ix. comparing in a predetermined manner, the second computed parameters of the second computed output with the designated parameters to provide a set of error free decoded data;

x. selectively permitting the passage of error free decoded data to a receiver.

17. A method of error correction as claimed in claim 16 wherein, said LogLikelihood Ratio values are transferred serially into the said variable node bank means.

18. A method of error correction as claimed in claim 16 wherein, said items are transferred parallelly from one location to another in the said error correction system.

19. An error correction system as claimed in claim 16 wherein, said selection of block is performed by using the equation:

$$LP_C = \frac{[I - \mathrm{mod}(I, z)]}{z}$$

where I is the address of an item in the said variable node bank means and z is the number of blocks in the said variable node bank means.

20. An error correction system as claimed in claim 16 wherein, said selection of sub-block is performed by using the equation:

$$LP_V = \frac{[C - \mathrm{mod}(C, z)]}{z}$$

where C is the destination address of an item in the said check node bank means, and z is the number of blocks in the said variable node bank means.

21. An error correction system as claimed in claim 16 wherein, the second computed output is computed in accordance with a min-sum equation.

22. An error correction system as claimed in claim 16 wherein, the second computed output is computed in accordance with a min-sum equation with a weightage of 0.75.

* * * * *